United States Patent
Kumar et al.

(10) Patent No.: US 6,807,507 B2
(45) Date of Patent: Oct. 19, 2004

(54) ELECTRICAL OVER STRESS (EOS) MONITOR

(76) Inventors: Vasudevan Seshadhri Kumar, Blk. 633, #09-5129, Ang Mo Kio Avenue 6, Singapore (SG), 560633; Manoj Kumar Dey, Blk. 604, Elias Road, #07-212, Singapore (SG), 510604; Pooranampillai Samuel Pooranakaran, Blk. 845, Woodlands Street 82, #05-129, Singapore (SG), 730845; KyawSwa Maung, Blk. 749, Yishun Street 72, #09-124, Singapore (SG), 760749

( * ) Notice: Subject to any disclaimer, the term of this patent is extended or adjusted under 35 U.S.C. 154(b) by 111 days.

(21) Appl. No.: 10/184,318

(22) Filed: Jun. 27, 2002

(65) Prior Publication Data

US 2003/0101016 A1 May 29, 2003

Related U.S. Application Data

(60) Provisional application No. 60/333,781, filed on Nov. 27, 2001.

(51) Int. Cl.[7] ......................... G06F 19/00; G01M 19/00
(52) U.S. Cl. ......................... 702/124; 702/58; 324/500; 324/522
(58) Field of Search ........................ 702/57–59, 69, 702/79, 81–84, 108, 117–120, 123–125; 324/500, 522, 523, 763, 765, 537, 603, 618, 676, 678, 710, 713, 102, 126

(56) References Cited

U.S. PATENT DOCUMENTS

| | | | | |
|---|---|---|---|---|
| 4,875,133 A | * | 10/1989 | Kawamura | 361/230 |
| 5,390,129 A | | 2/1995 | Rhodes | 702/118 |
| 5,557,559 A | | 9/1996 | Rhodes | 702/118 |
| 5,610,931 A | | 3/1997 | Huang | 372/38.09 |
| 6,014,030 A | | 1/2000 | Smith et al. | 324/705 |
| 6,101,458 A | * | 8/2000 | Sugasawara et al. | 702/119 |
| 6,339,380 B1 | | 1/2002 | Wilson | 361/56 |
| 6,353,520 B1 | | 3/2002 | Andresen et al. | 340/663 |
| 6,429,674 B1 | * | 8/2002 | Barth et al. | 324/763 |
| 2001/0011903 A1 | * | 8/2001 | O'Neill et al. | 324/763 |
| 2001/0056340 A1 | * | 12/2001 | Gorin et al. | 703/14 |

OTHER PUBLICATIONS

Kelly, M. et al. "Developing a Transient Induced Latch–up Standard for Testing Integrated Circcuits", Sep. 1999, Electrical Overstress/Electrostatic Discharge Symposium Proceedings, 1999, Sep. 28–30, 1999. pp. 178–189.*

Kelly, M. et al. Developing a transient induced latch–up standard for testing integrated circuits, Sep. 1999, Electrical Overstress/Electrostatic Discharge Symposium Proceedings, 1999, Sep. 28–30, 1999. pp. 178–189.*

"Tester for Electrostatic–Discharge Faults in Integrated Circuits", IBM Technical Disclosure Bulletin, Sep. 1985. vol. 28, Issue 4, pp. 1791–1792.*

* cited by examiner

*Primary Examiner*—Marc S. Hoff
*Assistant Examiner*—Manuel L Barbee
(74) *Attorney, Agent, or Firm*—Westman, Champlin & Kelly, P.A.

(57) ABSTRACT

An apparatus and associated method for testing an integrated circuit for electrical over stress includes a spike source configured to couple to an input of the integrated circuit, and responsively provide a signal spike to the input, and a current sensor configured to couple to a power supply. The power supply is coupled to the integrated circuit to provide power to the integrated circuit. The current sensor provides a sensor output related to the current supply to the integrated circuit from the power supply. The apparatus also includes test circuitry coupled to the sensor output configured to provide a failure output in response to a characteristic increase in power supply current sensed by the current sensor in response to an applied signal spike.

19 Claims, 4 Drawing Sheets

ELECTRICAL OVER STRESS (EOS) MONITOR

CROSS-REFERENCE TO RELATED APPLICATION

This application claims priority from U.S. Provisional Application No. 60/333,781 filed on Nov. 27, 2001 for inventors Vasudevan S. Kumar, Manoj K. Dey, Pooranampillai S. Pooranakaran and KyawSwa Maung and entitled ELECTRICAL OVER STRESS (EOS) MONITOR.

FIELD OF THE INVENTION

The present invention relates generally to integrated circuit testers, and more particularly but not by limitation to integrated circuit testers for testing for electrical overstress.

BACKGROUND OF THE INVENTION

Semiconductor devices are typically designed to withstand a specified input voltage overstress, but due to fabrication process variations there is a potential that some devices within a large manufacturing lot will not meet the specification. Electrical overstress (EOS) is a leading cause of damage to integrated circuits. EOS of an integrated circuit generally results from an external source discharging large transient voltages, typically over a short period of time, over a terminal or pin of the integrated circuit. EOS events include very fast transients such as electrostatic discharge (ESD), and slower transients produced by power line glitches or dropouts.

Electrical spikes or transients are a key cause of electrical overstress in semiconductors, and in many cases these electrical spikes are unavoidable in electronic applications. There is a high probability that some of the semiconductor devices in a large sample will be weak and susceptible to partial damage during an electrical spike. This can be true even though the magnitude of the electrical pulse is within a specified range for the device. The amount of damage to the device caused by the electrical overstress is related to the electrical transient pulse width. Repetitive occurrences of these electrical transients will ultimately lead to permanent damage of the device.

There is a desire to find those devices that may fail early in the manufacturing process so that the overall product quality can be improved and the costs to reliably manufacture the product may be reduced. It is therefore desirable to identify, during the manufacturing process, those semiconductor devices that may fail at an abnormally high rate in normal operations. By removing those devices that may fail from reaching the end user, the manufacturer can reduce the number of customer returns due to failures, and therefore reduce their overall manufacturing costs. It is further desirable to identify those semiconductor devices that may fail as quickly and efficiently as possible to further reduce costs.

One prior art tester uses accelerated life testing, which electrically ages the semiconductor device in its final packaged form to identify defects that would result in premature failure of the device. Most processes used for testing semiconductor devices apply a temperature stress (heat) to bring a defective device to its failure point more quickly. These tests are often referred to as "burn-in" because of the use of heat. To generate this heat the device is either placed in an oven to provide an external heat source, or the heat source is placed in direct contact with the semiconductor device. The heat source may also be self-generated by electrically conditioning the device to an extreme electrical condition. Thus failures of defective devices can be occur in just a few hours of burn-in as opposed to months or years under normal conditions.

Burn-in testing of semiconductor devices still requires a few hours of testing to determine if a device is defective. Further, such tests do not necessarily detect a device that is susceptible to exposure due to electrical over stress.

Embodiments of the present invention provide solutions to these and other problems, and offer other advantages over the prior art.

SUMMARY OF THE INVENTION

The present invention is directed towards an apparatus for testing an integrated circuit for electrical over stress. The apparatus includes a spike source configured to couple to an input of the integrated circuit, and responsively provide a signal spike to the input, and a current sensor configured to couple to a power supply. The power supply is coupled to the integrated circuit to provide power to the integrated circuit, and the current sensor provides a sensor output related to the current supply to the integrated circuit from the power supply. The apparatus also includes test circuitry coupled to the sensor output configured to provide a failure output in response to an increase in the power supply current sensed by the current sensor in response to an applied signal spike.

Other features and benefits that characterize embodiments of the present invention will be apparent upon reading the following detailed description and review of the associated drawings.

DETAILED DESCRIPTION OF ILLUSTRATIVE EMBODIMENTS

Figure 1:
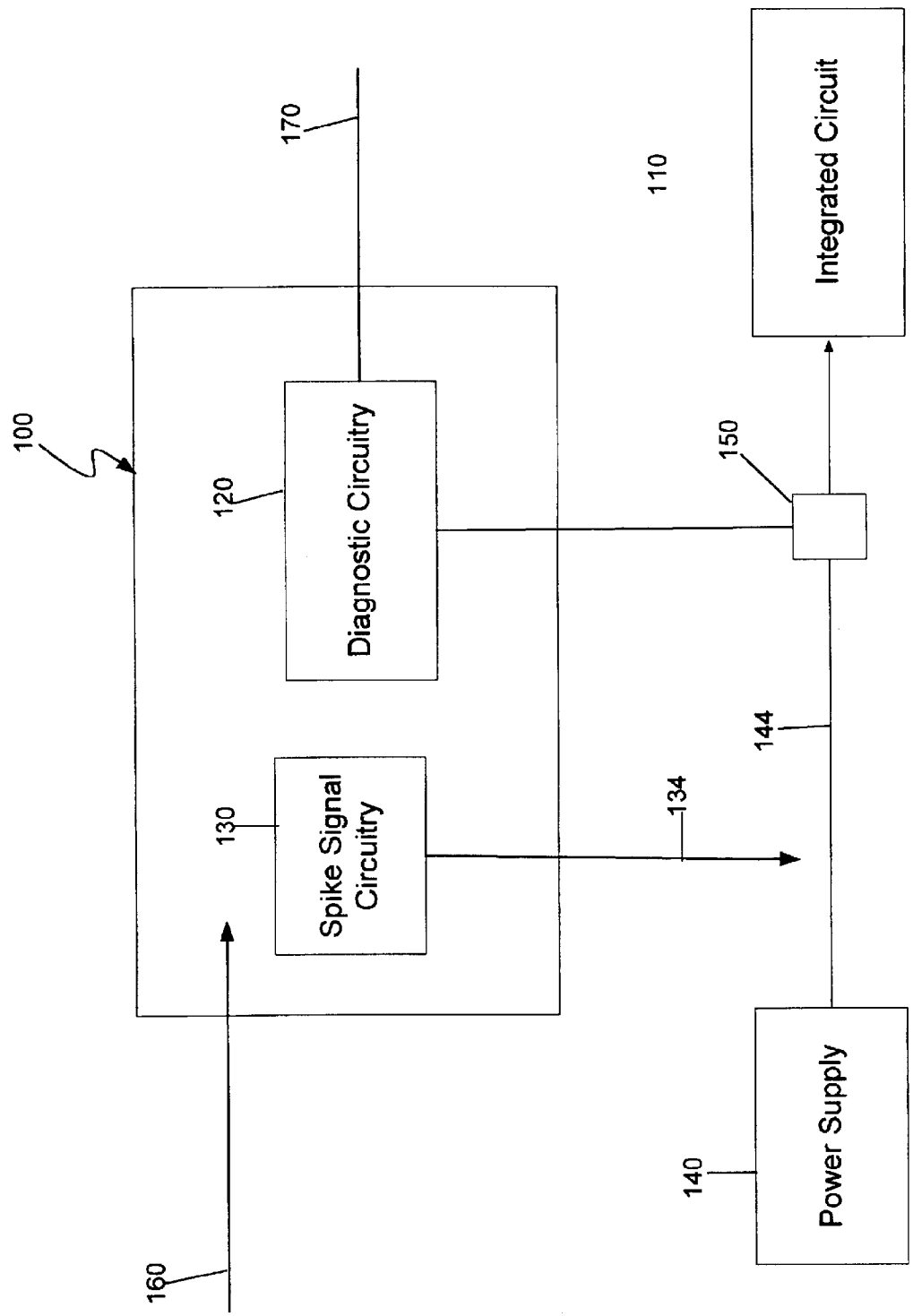
FIG. 1 is a simplified block diagram of an integrated circuit tester in occurrence with one embodiment of the present invention.

Referring now to FIG. 1, an integrated circuit diagnostic system 100 is shown. Integrated circuit diagnostic system 100 like the one shown in FIG. 1 includes, diagnostic circuitry 120, spike signal circuitry 130, input 160 and output 170. Integrated circuit diagnostic system 100 is shown coupled to integrated circuit 110, current sensor 150 and power supply 140.

In one aspect, the present invention includes the recognition that damage to integrated circuit 110 caused by an electrical spike causes a momentary increase in current drawn from power supply 140. More reliable integrated circuits can withstand these electrical spikes without failing, i.e. a more reliable circuit will not draw a current that exceeds a threshold value. However, in defective integrated circuits there is a measurable increase in power supply current during the electrical spike. This increase is only temporary as once the electrical spike is removed the power supply current returns to normal. Integrated circuits that show an increase in the power supply current during an electrical spike are more likely to fail in the field, and present concerns about the device's reliability. Therefore, integrated circuit diagnostic system 100 is configured to provide an electrical spike or transient 134 to integrated circuit 110 and detect any resultant increase in power supply current to determine if integrated circuit 110 is susceptible to electrical overstress (EOS).

In operation, according to one embodiment of the present invention, integrated circuit 110 is connected to power supply 140 by power supply line 144. Current sensor 150 is connected to power supply 140 and to integrated circuit diagnostic system 100. Integrated circuit diagnostic system 100 receives an input 160 to start the electrical overstress test. Spike signals circuitry 130 causes an electrical spike to be applied (shown as arrow 134) to integrated circuit 110. In one embodiment, this electrical spike has a magnitude of one volt for a duration of one microsecond. However, other magnitudes, durations or types may be used for the electrical spike or transient, or for example the electrical spike may be alternating current or direct current, and the polarity of the spike may be positive or negative. Current sensor 150 senses the current on power supply line 144, and provides a signal to diagnostic circuitry 120. Diagnostic circuitry 120 receives the signal from current sensor 150 following or during the electrical spike. Diagnostic circuitry 120 then processes the signal to determine if integrated circuit 110 passed the electrical overstress test by comparing the power supply current to a threshold. The threshold value can include magnitude and/or duration information, and can be selected based upon experimentation with a particular integrated circuit. If the power supply current exceeded the threshold during the electrical spike, diagnostic circuitry 120 provides an output 170 indicating that integrated circuit 110 failed the EOS test. If however, the power supply current does not exceed the threshold during the electrical spike then diagnostic circuitry 120 indicates that integrated circuit 110 passed the EOS test via output 170.

Figure 2:
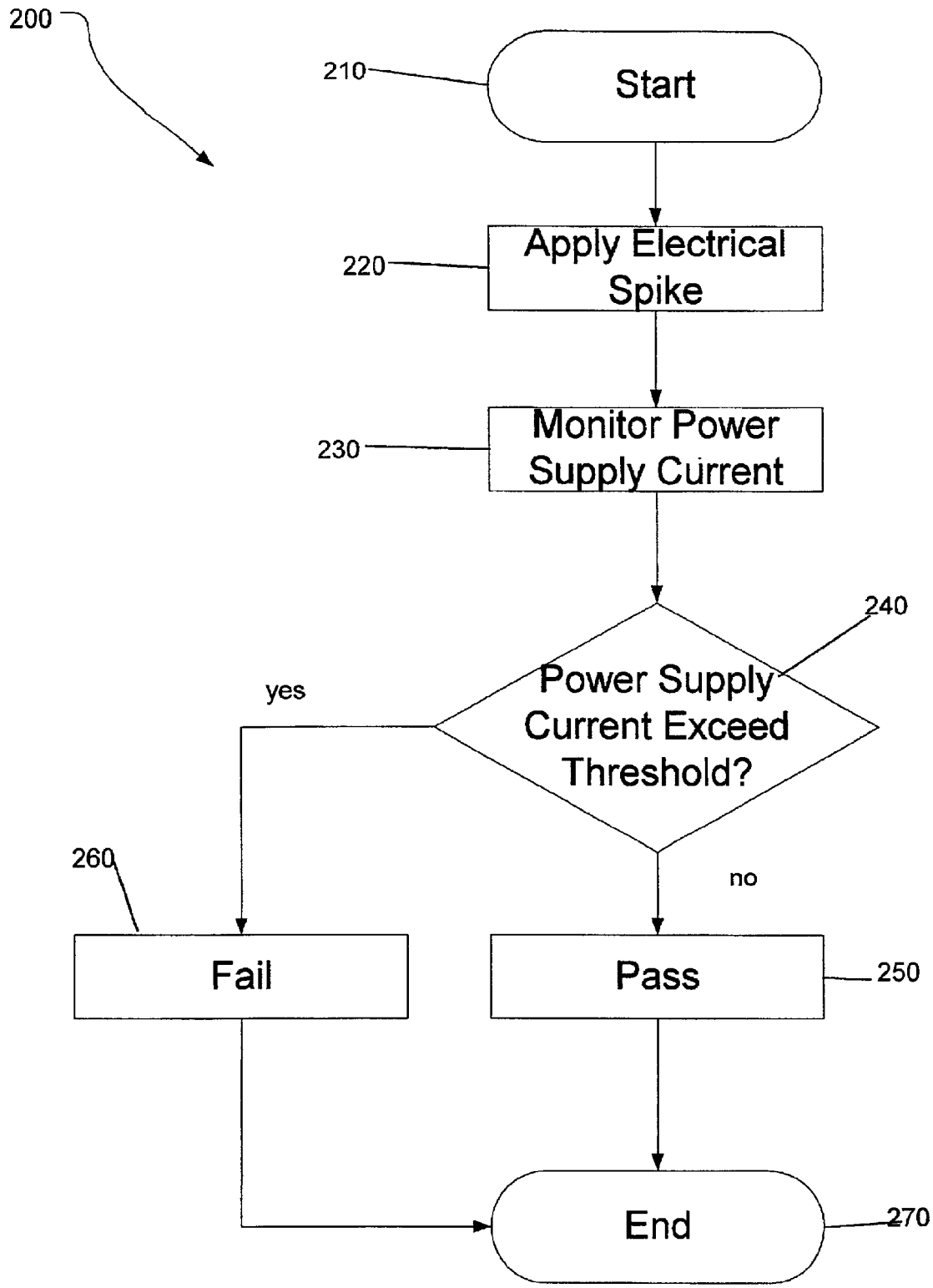
FIG. 2 is a simplified flow chart showing steps in accordance with one embodiment of the present invention.

FIG. 2 is a simplified flow chart 200 showing steps in accordance with one aspect of the present invention. At 210, the integrated circuit 110 is powered on by power supply 170. At 220, an electrical spike or transient is applied to integrated circuit 110 by spike signal circuitry 130. At 230, diagnostic circuitry 120 monitors the power supply current by receiving from current sensor 150 a signal representing the measured current flowing from power supply 140 to integrated circuit 110. At 240, diagnostic circuitry 120 determines if the measured current is within acceptable current variations. An output signal 170 is provided at 250 indicating that integrated circuit 110 passes the electrical overstress test if diagnostic circuitry 120 determines that the power supply current, during or following the electrical spike, is within acceptable current variations for integrated circuit 110. At 260, an indication is provided, as output 170, if the diagnostic circuitry 120 determines that the power supply current exceeded the allowable variations for integrated circuit 110 that integrated circuit 110 failed the electrical overstress test and should be removed from the manufacturing process. At 270, the electrical overstress test is completed.

In one aspect of the present invention diagnostic circuitry 120 is configured to provide an output when a threshold value is exceeded, but not to provide an output if the threshold value is not exceeded. This threshold value may either be fixed, using a fixed component resister, or value stored in a memory or it may be adjustable. When diagnostic circuitry 120 features an adjustable threshold value, the value may be selectable based upon the specific integrated circuit 110 under testing. The threshold value used by diagnostic circuitry 120 may be based upon an increase in the power supply current above a certain value, based upon the duration of an increase in the power supply current above a certain value, or both. The threshold can also be a particular signal or pattern to which power supply current can be compared.

Diagnostic circuitry 120 can be synchronized with the electrical spike 134 to analyze the power supply current change during the electrical spike, or it can be configured to analyze the power supply current following the electrical spike. Diagnostic circuitry 120 can be configured to analyze an analog signal received from the current sensor 150, or it can be configured to analyze a digital signal that is representative of the power supply current during or following the electrical spike.

Figure 3:
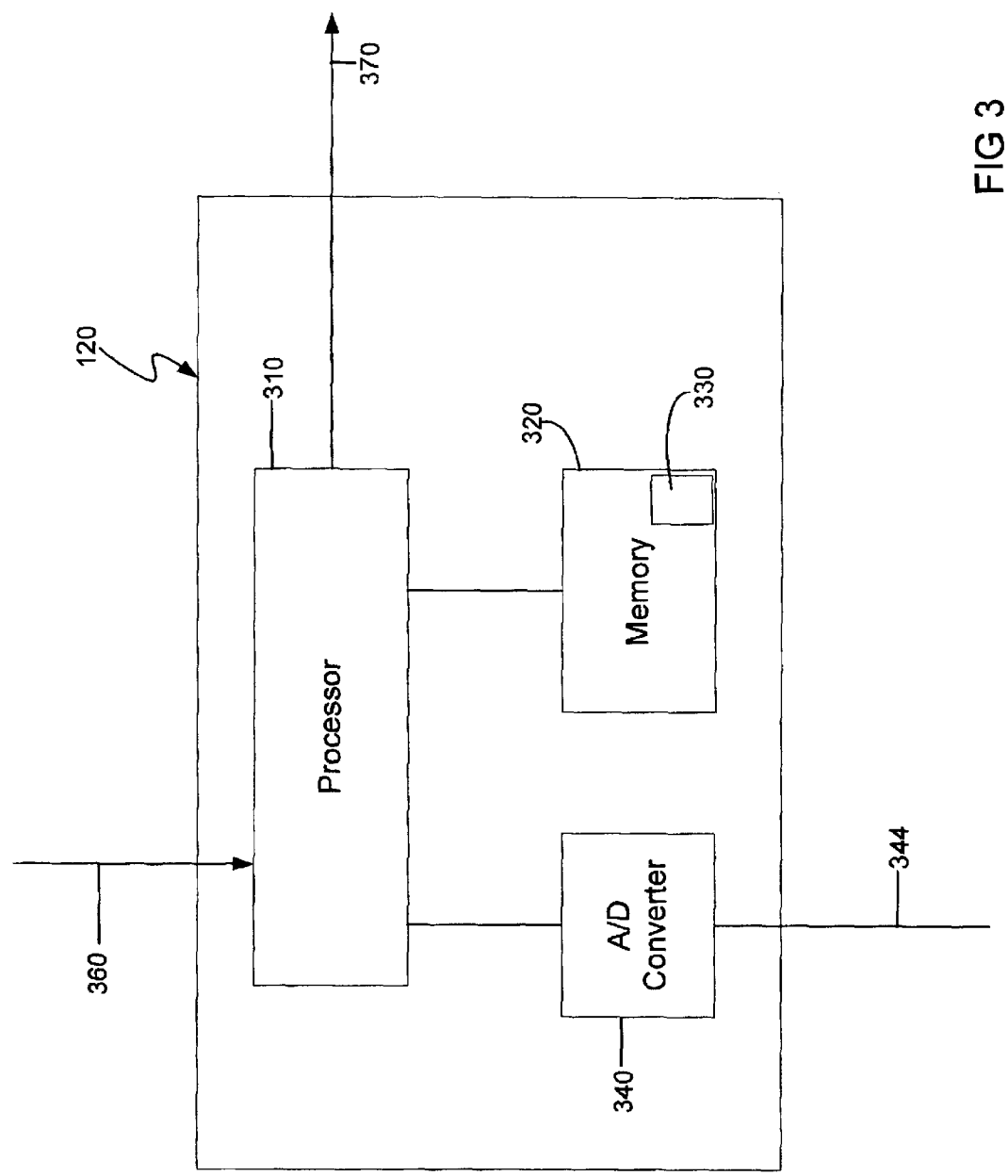
FIG. 3 is a simplified block diagram of diagnostic circuitry in accordance with one embodiment of the present invention.

Referring now to FIG. 3, diagnostic circuitry 120 is shown according to one aspect of the present invention. In this embodiment diagnostic circuitry 120 is configured to analyze a digital signal or value representative of the power supply current sensed by current sensor 150. Diagnostic circuitry 120 comprises a processor 310, a memory 320, an analog to digital converter 340, current sensor input 344 and output 370. FIG. 3 also shows an optional input 360 which provides an input from an outside source other than from current sensor 150 to the processor 310, such as a from a user.

In operation, during an electrical spike, current sensor 150 senses current on power supply line, and provides an analog signal 344 to analog to digital converter 340. The sensing can also be performed prior to and/or after a spike. Analog to digital converter 340 converts analog signal 344 to a digital value, which is representative of analog signal 344. The digital value determined for analog signal 344 by analog to digital converter 340 is passed to processor 310 for processing.

Processor 310 is configured to determine if integrated circuit 110 under testing has passed an electrical overstress test. According to one aspect of the present invention, processor 310 is a microprocessor. However, processor 310 can be any device configured to provide an output based on a received signal from current sensor 150 and a comparison to a predetermined value, such as an ASIC. Processor 310 receives the digital value of analog signal 344 from analog to digital converter 340. Depending on the configuration, processor 310 may call upon memory 320 to receive a threshold value 330, which represents an acceptable value for the power supply current during an electrical spike.

Memory 320 may comprise a short-term temporary memory system such as RAM, or a long-term permanent memory system such as ROM, EEPROM or other storage elements. Further, memory 320 can be configured to store information related to the specific integrated circuit being tested such as lot information or current tolerances. In one embodiment memory 320 contains a threshold for integrated circuit 110 value stored at 330. Memory 320 provides to processor 310 threshold value 330.

After receiving threshold 330 from memory 320 processor 310 then determines if integrated circuit 110 passed the electrical overstress test. If the digital value of the power supply current during the electrical overstress test exceeds the value stored in memory 320 then processor 310 provides an output 370 indicating that integrated circuit 110 failed the test. If however, the digital value of the power supply current does not exceed threshold value 330 provided by memory 320 then processor 310 provides an output 370 indicating that integrated circuit 110 passes the electrical overstress test, or in the alternative provides no output. If the threshold value 330 includes duration, pattern, or signal profile information, an appropriate comparison is used. Further, if a more complex comparison is performed or a number of thresholds are used, the output can provide an indication of a marginal component that may still be suitable for some purposes.

Figure 4:
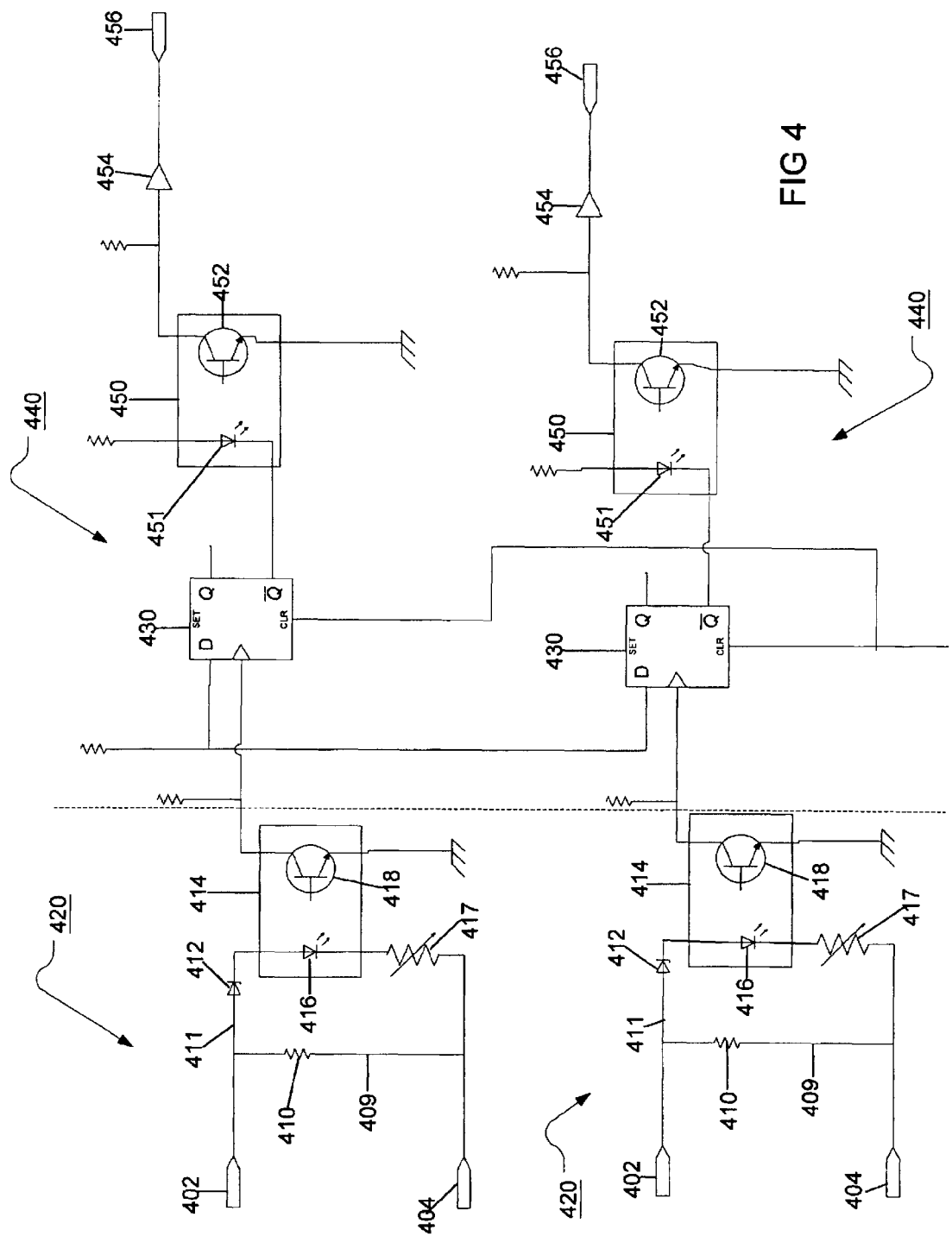
FIG. 4 is a schematic diagram of an integrated current sensor and diagnostic circuitry in accordance with one embodiment of the present invention.

Referring now to FIG. 4, a schematic diagram that includes current sensor 420 and diagnostic circuitry 440 in accordance with one aspect of the present invention is shown. In this embodiment current sensor 420 is a threshold current sensor. Current flows in through input 402, flows along a first current path 409 and flows out through output 404. Resister 410 generates a voltage drop as the current flows through it. Resister 410 in one embodiment is a 2.5 OHM resister. However, other resistance values may be used. A signal diode 412, an opto-coupler 414 and a potentiometer 417 are provided in series on a second current path 411 that is parallel with first current path 409. Potentiometer 417 is, in one embodiment, adjustable up to a resistance of 100 OHMS. However, other adjustable or fixed resistance values may be used. Opto-coupler 414 contains a light emitting diode (LED) 416 and an output transistor 418. LED 416 emits radiation when the current flow on line 411 exceeds a preset value as determined by potentiometer 417. Transistor 418 generates an electrical signal when LED 416 emits radiation in response to an increase in the current on line 411 and provides the signal to diagnostic circuitry 440.

Diagnostic circuitry 440 comprises a Flip-Flop 430, and the opto-coupler 450 and a buffer 454. Flip-Flop 430 is, in one embodiment, a clocked D-type Flip-Flop such as a 74F74. Other types of Flip-Flops may be used. Flip-Flop 430 has a data input D that is connected to a high or "one" level at five volts. Other voltages may be used. Flip-Flop 430 is clocked by the output of opto-coupler 414. Depending on the needs of the application, additional clock pulse shaping circuitry can be used. When there is a pulse output from opto-coupler 414 the pulse output clocks Flip-Flop 430 to transfer the data input to the $\overline{Q}$ output the $\overline{Q}$ signal thus goes low ("0"). When Flip-Flop 430 has latched a pulse output to an event an electrical signal is provided to opto-coupler 450. Opto-coupler 450 comprises LED 451 and transistor 452. When current is provided to opto-coupled 450 LED 451 illuminates and transistor 452 conducts. When transistor 452 conducts it couples an electrical signal to buffer 454. Buffer 454 buffers this signal and the buffered signal is output at output 456. This output indicates that integrated circuit 110 under testing failed the electrical overstress test.

In summary, the present invention is directed towards an apparatus for testing an integrated circuit 110. The apparatus 100 includes a spike source 130 configured to couple to an input of the integrated circuit 110 and responsively provide a signal spike 134 to the input and a current sensor 150, 420 configured to couple to a power supply 140. The power supply 140 is coupled to the integrated circuit 110 to provide power to the integrated circuit 110. The current sensor 150, 420 provides a sensor output 344 related to the current supplied to the integrated circuit 110 from the power supply 140. The apparatus 100 also includes test circuitry 120, 440 coupled to the sensor output 344 configured to provide a failure output 170, 370, 456 in response to an increase in power supply current sensed by the current sensor 150, 420 in response to an applied signal spike.

The present invention is also directed towards a method of testing an integrated circuit 110. The method includes coupling the integrated circuit 100 to a power supply 140 and applying a signal spike 134 to an input of the integrated circuit 110. The method also includes sensing a power supply current from the power supply 140 coupled to the integrated circuit 110, in providing a failure output 170, 370, 456 in response to an increase in the power supply current sensed in response to the applied signal spike 134.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the diagnostic system while maintaining substantially the same functionality without departing from the scope and spirit of the present invention. In addition, although the preferred embodiment described herein is directed to a general diagnostic system for integrated circuits, it will be appreciated by those skilled in the art that the teachings of the present invention are particularly applicable to magnetic storage systems.

What is claimed is:

1. An apparatus for testing an integrated circuit, comprising:
    an electrical overstress (EOS) spike source configured to be coupled to an input of an integrated circuit and responsively provide an EOS signal spike to the input which is configured to electrically overstress the integrated circuit;
    a current sensor configured to couple to a power supply, the power supply coupled to the integrated circuit to provide power to the integrated circuit, the current sensor providing a sensor output related to the current supplied to the integrated circuit from the power supply; and
    diagnostic circuitry coupled to the sensor output configured to provide a failure output in response to a characteristic increase in power supply current sensed by the current sensor in response to the applied EOS signal spike.

2. The apparatus of claim 1 wherein the diagnostic circuitry further comprises:
    a processor configured to receive a signal from the current sensor, compare the received signal against a threshold value, and provide an output signal based on the comparison.

3. The apparatus of claim 2 wherein the diagnostic circuitry further comprises:
    a storage device configured to store the threshold value for the integrated circuit being tested and to provide the threshold value to the processor; and
    wherein the processor is further configured to receive the threshold value from the storage device.

4. The apparatus of claim 3 wherein the diagnostic circuitry further comprises:
    an analog to digital converter configured between the current sensor and the processor, the analog to digital converter to provide a digital signal to the processor indicative of an analog signal received from the current sensor.

5. The apparatus of claim 1 wherein:
    the power supply is integrated into the apparatus coupled to the integrated circuit.

6. The apparatus of claim 1 wherein the current sensor is integrated into the apparatus.

7. The apparatus of claim 1 wherein the current sensor provides to the diagnostic circuitry the actual current.

8. The apparatus of claim 1 wherein the EOS signal spike is applied directly to the integrated circuit.

9. The apparatus of claim 1 wherein the EOS signal spike is applied to the power supply line.

10. The apparatus of claim 1 wherein the testing is automated.

11. The apparatus of claim 1 wherein the current sensor provides a signal indicative of the actual current to the diagnostic circuitry.

12. The apparatus of claim 1 wherein the EOS spike source is further configured to provide a an EOS signal spike of one volt for the duration of one microsecond.

13. A method for testing an integrated circuit, comprising the steps of:

coupling the integrated circuit to the power supply;

applying an electrical overstress (EOS) spike signal spike to an input of the integrated circuit, which spike would electrically overstress the integrated circuit;

sensing a power supply current from the power supply coupled to the integrated circuit; and providing a failure output in response to a characteristic increase in the power supply current sensed in response to the applied EOS signal spike.

14. The method of claim 13 wherein the applying step applies an EOS spike signal of one volt for one microsecond to the input of the integrated circuit.

15. The method of claim 13 further comprising:

comparing the power supply current sensed by the current sensor with a threshold value; and providing a failure output in response to the current sensed that exceeds the threshold value.

16. The method of claim 15:

wherein the comparing step compares the current sensed with a plurality of threshold values; and wherein the failure output indicates for some of the threshold values that are exceeded that the integrated circuit may be useable.

17. An apparatus for testing an integrated circuit for electrical overstress, comprising:

an electrical overstress (EOS) spike signal generating means for applying an EOS electrical transient to an input of the integrated circuit, the EOS electrical transient is configured to electrically overstress the circuit;

a current sensing means for sensing a power supply current on a characteristic power supply line from a power supply to the integrated circuit;

a diagnostic means for providing a failure output in response to a signal received from the current sensing means indicating an increase in the power supply current sensed by the current sensing means in response to applied EOS electrical transient.

18. The apparatus of claim 17 wherein the diagnostic means further comprises:

a processor means connected to the current sensing means and an output processing the signal from the current sensing means and comparing the signal with a threshold value.

19. The apparatus at claim 18 wherein the diagnostic means further comprises:

a storage means connected to the processor means storing the threshold value and providing the threshold value to the processor means.

* * * * *